US011843000B2

(12) United States Patent
Park et al.

(10) Patent No.: US 11,843,000 B2
(45) Date of Patent: Dec. 12, 2023

(54) SEMICONDUCTOR DEVICE

(71) Applicant: Samsung Electronics Co., Ltd., Suwon-si (KR)

(72) Inventors: Beom Jin Park, Hwaseong-si (KR); Myung Gil Kang, Suwon-si (KR); Dong Won Kim, Seongnam-si (KR); Keun Hwi Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 293 days.

(21) Appl. No.: 17/336,785

(22) Filed: Jun. 2, 2021

(65) Prior Publication Data

US 2022/0130865 A1 Apr. 28, 2022

(30) Foreign Application Priority Data

Oct. 22, 2020 (KR) .................. 10-2020-0137504

(51) Int. Cl.
*H01L 27/12* (2006.01)
*H01L 27/092* (2006.01)
(Continued)

(52) U.S. Cl.
CPC .... *H01L 27/1203* (2013.01); *H01L 21/02603* (2013.01); *H01L 21/84* (2013.01);
(Continued)

(58) Field of Classification Search
CPC ........... H01L 27/1203; H01L 21/02603; H01L 21/84; H01L 27/092; H01L 29/0673; H01L 29/41733; H01L 29/42392; H01L 29/66439; H01L 29/66545; H01L 29/66553; H01L 29/66742; H01L 29/775; H01L 29/78618; H01L 29/78696; H01L 21/823878; H01L 29/1083;
(Continued)

(56) References Cited

U.S. PATENT DOCUMENTS 7,274,051 B2  9/2007  Kim et al.
9,276,064 B1  3/2016  Zang et al.
(Continued)

FOREIGN PATENT DOCUMENTS

WO  WO-2018182619 A1 * 10/2018

*Primary Examiner* — Tong-Ho Kim
(74) *Attorney, Agent, or Firm* — Harness, Dickey & Pierce, P.L.C.

(57) ABSTRACT

A semiconductor device that reduces the occurrence of a leakage current by forming a doped layer in each of an NMOS region and a PMOS region on an SOI substrate, and completely separating the doped layer of the NMOS region from the doped layer of the PMOS region using the element isolation layer is provided. The semiconductor device includes a first region and a second region adjacent to the first region, a substrate including a first layer, an insulating layer on the first layer, and a second layer on the insulating layer, a first doped layer on the second layer in the first region and including a first impurity, a second doped layer on the second layer in the second region and including a second impurity different from the first impurity, and an element isolation layer configured to separate the first doped layer from the second doped layer, and in contact with the insulating layer.

20 Claims, 17 Drawing Sheets

(51) Int. Cl.
  *H01L 29/06* (2006.01)
  *H01L 29/423* (2006.01)
  *H01L 29/417* (2006.01)
  *H01L 29/775* (2006.01)
  *H01L 29/786* (2006.01)
  *H01L 21/02* (2006.01)
  *H01L 21/84* (2006.01)
  *H01L 29/66* (2006.01)

(52) U.S. Cl.
  CPC ........ *H01L 27/092* (2013.01); *H01L 29/0673* (2013.01); *H01L 29/41733* (2013.01); *H01L 29/42392* (2013.01); *H01L 29/66439* (2013.01); *H01L 29/66545* (2013.01); *H01L 29/66553* (2013.01); *H01L 29/66742* (2013.01); *H01L 29/775* (2013.01); *H01L 29/78618* (2013.01); *H01L 29/78696* (2013.01)

(58) Field of Classification Search
  CPC ....... H01L 29/41766; H01L 21/823807; H01L 21/823828; H01L 21/823857; B82Y 10/00
  USPC .......................................................... 257/351
  See application file for complete search history.

(56) References Cited

U.S. PATENT DOCUMENTS

| | | |
|---|---|---|
| 9,640,671 B2 | 5/2017 | Pillarisetty et al. |
| 10,249,709 B2 | 4/2019 | Cheng et al. |
| 10,573,755 B1 | 2/2020 | Frougier et al. |
| 2017/0256612 A1* | 9/2017 | Guillorn ........... H01L 21/30604 |
| 2020/0044088 A1 | 2/2020 | Chiang et al. |
| 2020/0411641 A1 | 12/2020 | Noh et al. |

* cited by examiner

SEMICONDUCTOR DEVICE

CROSS-REFERENCE TO RELATED APPLICATION

This application claims priority from Korean Patent Application No. 10-2020-0137504 filed on Oct. 22, 2020 in the Korean Intellectual Property Office, and all the benefits accruing therefrom under 35 U.S.C. § 119, the contents of which in its entirety are herein incorporated by reference.

BACKGROUND

Example embodiments relate to a semiconductor device. More particularly, example embodiments to a semiconductor device including a Multi-Bridge Channel Field Effect Transistor (MBCFET™).

As one of scaling techniques for increasing the density of semiconductor devices, a multi-gate transistor has been proposed, in which a fin- and/or nanowire-shaped silicon body is formed on a substrate and a gate is formed on the surface of the silicon body.

Since the multi-gate transistor uses a three-dimensional (3D) channel, scaling of the multi-gate transistor may be more easily achieved. Alternatively or additionally, current control capability can be improved without increasing the gate length of the multi-gate transistor. Alternatively or additionally, a short channel effect (SCE) in which the potential of a channel region is affected by a drain voltage can be effectively or more effectively suppressed.

SUMMARY

Some example embodiments provide a semiconductor device that reduces the occurrence of a leakage current by forming a doped layer in each of an NMOS region and a PMOS region on a silicon-on-insulator (SOI) substrate, and completely separating the doped layer of the NMOS region from the doped layer of the PMOS region using the element isolation layer.

According to some example embodiments, there is provided a semiconductor device comprising a first region and a second region adjacent to the first region, a substrate including a first layer, an insulating layer on the first layer, and a second layer on the insulating layer, a first doped layer in the first region and on the second layer, extending in a first direction, and including a first impurity, a second doped layer in the second region and on the second layer, extending in the first direction, and including a second impurity different from the first impurity, a first plurality of nanowires extending in the first direction on the first doped layer, and sequentially spaced apart from each other in a vertical direction, a second plurality of nanowires extending in the first direction on the second doped layer and sequentially spaced apart from each other in the vertical direction, a first gate electrode extending in a second direction that crosses the first direction, the first gate electrode surrounding the first plurality of nanowires, a second gate electrode extending in the second direction, the second gate electrode surrounding the second plurality of nanowires, and an element isolation layer configured to separate the first doped layer from the second doped layer, and contacting the insulating layer.

According to some example embodiments, there is provided a semiconductor device comprising an NMOS region and a PMOS region adjacent to the NMOS region, a first lower pattern protruding in a vertical direction from a first silicon layer in the NMOS region, extending in a first direction, and including a first portion of an insulating layer, a first portion of a second silicon layer, and a first doped layer including a first impurity, the first portion of the insulating layer, the first portion of the second silicon layer, and the first doped layer arranged sequentially on the first silicon layer, a second lower pattern protruding in the vertical direction from the first silicon layer in the PMOS region, extending in the first direction, and including a second portion of the insulating layer, a second portion of the second silicon layer, and a second doped layer including a second impurity different from the first impurity, the second portion of the insulating layer, the second portion of the second silicon layer, and the second doped layer arranged sequentially on the first silicon layer, a first plurality of nanowires extending in the first direction on the first lower pattern and sequentially spaced apart from each other in the vertical direction, a second plurality of nanowires extending in the first direction on the second lower pattern and sequentially spaced apart from each other in the vertical direction, a first gate electrode extending in a second direction crossing the first direction and surrounding the first plurality of nanowires, a second gate electrode extending in the second direction and surrounding the second plurality of nanowires, and an element isolation layer configured to separate the first lower pattern from the second lower pattern and contacting the insulating layer.

According to some example embodiments, there is provided a semiconductor device comprising an NMOS region and a PMOS region adjacent to the NMOS region, a substrate including a first silicon layer, an insulating layer on the first silicon layer, and a second silicon layer on the insulating layer, a first doped layer on the second silicon layer in the NMOS region, extending in a first direction, and including a first impurity, a second doped layer on the second silicon layer in the PMOS region, extending in the first direction, and including a second impurity different from the first impurity, a first plurality of nanowires extending in the first direction on the first doped layer and sequentially spaced apart from each other in a vertical direction, a second plurality of nanowires extending in the first direction on the second doped layer and sequentially spaced apart from each other in the vertical direction, a first gate electrode extending in a second direction that crosses the first direction, the first gate electrode surrounding the first plurality of nanowires, a second gate electrode extending in the second direction and surrounding the second plurality of nanowires, a first source/drain region on at least one side of the first gate electrode and at least partially extending into the first doped layer, and a second source/drain region on at least one side of the second gate electrode and at least partially extending into the second doped layer, and an element isolation layer configured to separate the first doped layer from the second doped layer, and having a bottom surface formed inside the first silicon layer. The insulating layer, the second silicon layer, and the first doped layer protrude from the first silicon layer in the vertical direction to be arranged as a first lower pattern, and the insulating layer, the second silicon layer, and the second doped layer protrude from the first silicon layer in the vertical direction to be arranged as a second lower pattern.

However, example embodiments are not restricted to the one set forth herein. The above and other aspects of some example embodiments will become more apparent to one of ordinary skill in the art to which example embodiments pertains by referencing the detailed description of some example embodiments given below.

BRIEF DESCRIPTION OF THE DRAWINGS

The above and other aspects and features of inventive concepts will become more apparent by describing in detail some example embodiments thereof with reference to the attached drawings, in which.

DETAILED DESCRIPTION OF SOME EXAMPLE EMBODIMENTS

Hereinafter, a semiconductor device according to some embodiments of inventive concepts will be described with reference to FIGS. 1 to 3.

Figure 1:
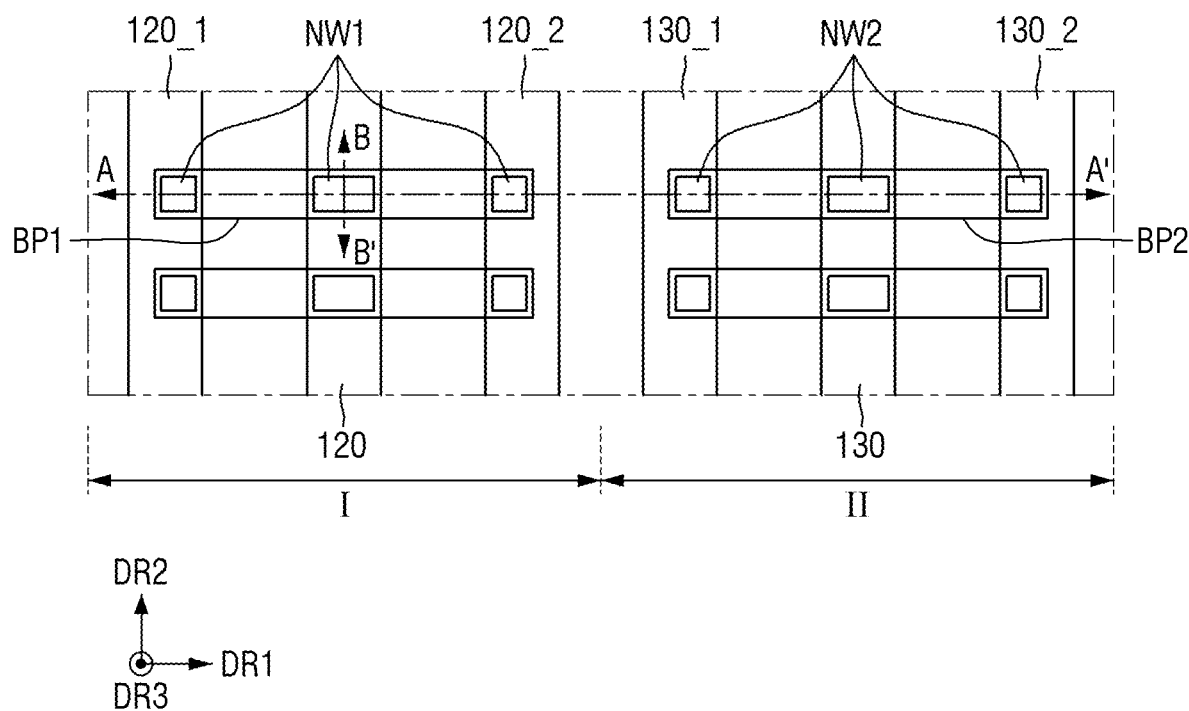
FIG. 1 is a layout diagram illustrating a semiconductor device according to some embodiments of inventive concepts.

FIG. 1 is a layout diagram illustrating a semiconductor device according to some embodiments of inventive concepts. FIG. 2 is a cross-sectional view taken along line A-A' of FIG. 1. FIG. 3 is a cross-sectional view taken along line B-B' of FIG. 1.

For simplicity of description, in FIG. 1, a first interlayer insulating layer 150, a second interlayer insulating layer 160, a first source/drain contact 171, and a second source/drain contact 172 are not illustrated but may be present and will be described below in more detail.

Figure 2:
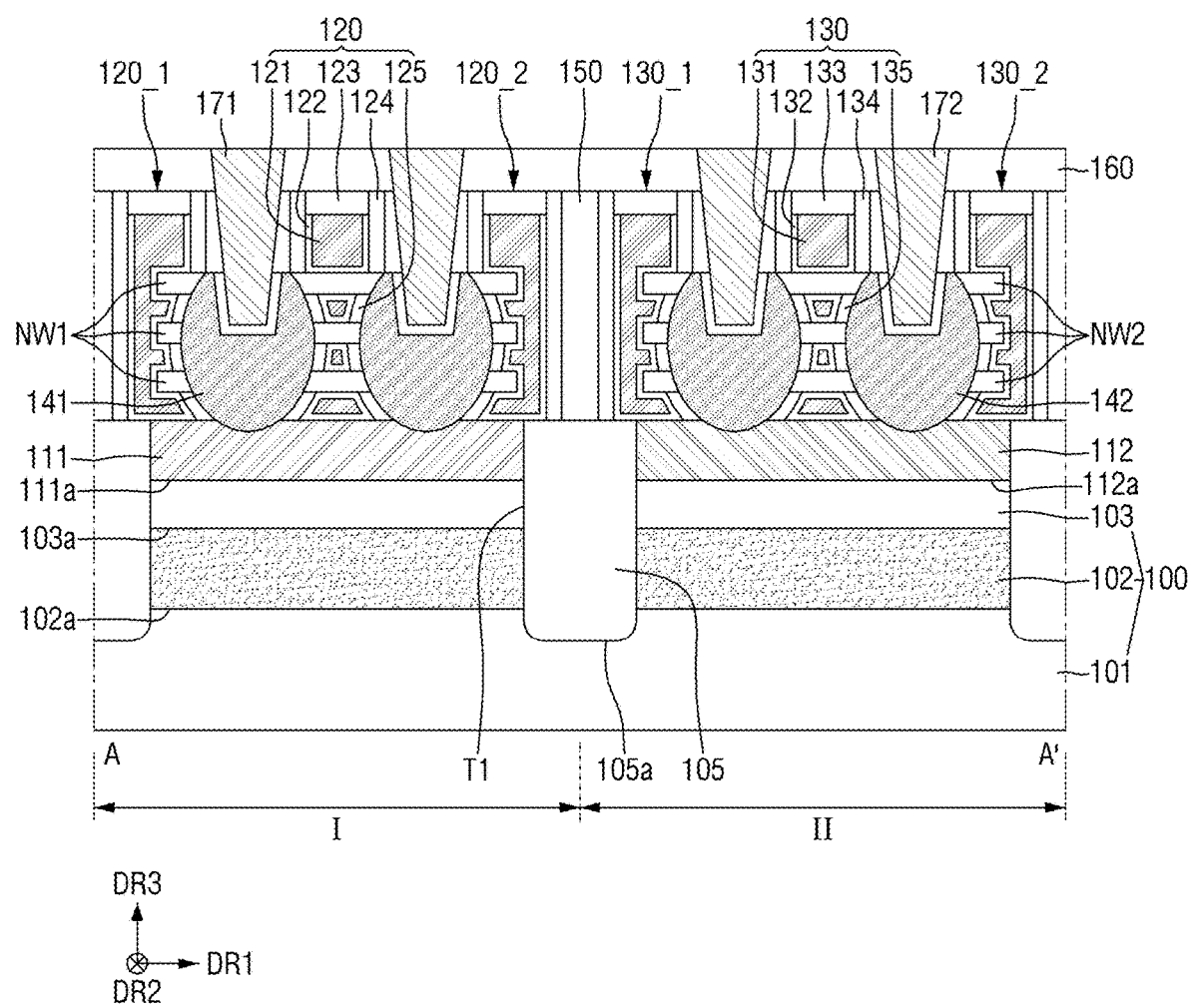
FIG. 2 is a cross-sectional view taken along line A-A' of FIG. 1.
Figure 3:
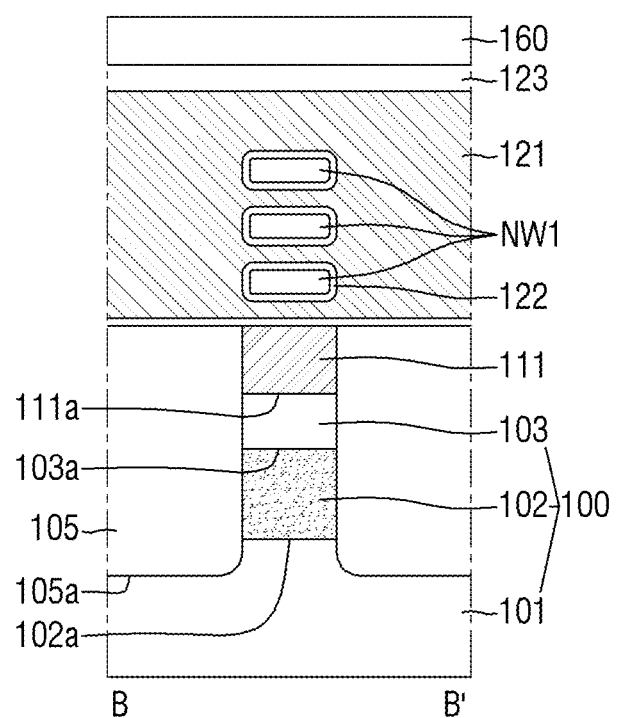
FIG. 3 is a cross-sectional view taken along line B-B' of FIG. 1.

Referring to FIGS. 1 to 3, a semiconductor device according to some embodiments of inventive concepts includes a substrate 100, an element isolation layer 105, a first doped layer 111, a second doped layer 112, a first plurality of nanowires NW1, a second plurality of nanowires NW2, a first gate structure 120, a second gate structure 130, first to fourth fin-cut gate structure 120_1, 120_2, 130_1, and 130_2, a first source/drain region 141, a second source/drain region 142, a first interlayer insulating layer 150, a second interlayer insulating layer 160, a first source/drain contact 171, a second source/drain contact 172, and a silicide layer 175.

The semiconductor device according to some example embodiments of inventive concepts may include a first region I and a second region II adjacent to the first region I. The first region I may be or correspond to, for example, an NMOS region such as a region to include NMOS transistors and to not include PMOS transistors. The second region II may be, for example, a PMOS region such as a region to include PMOS transistors and to not include NMOS transistors.

The substrate 100 may be disposed over the first region I and the second region II. The substrate 100 may be or correspond to a silicon-on-insulator (SOI) substrate and/or a silicon-on-sapphire (SOS) substrate. The substrate 100 may include a first layer 101, an insulating layer 102 disposed on the first layer 101, and a second layer 103 disposed on the insulating layer 102.

Each of the first layer 101 and the second layer 103 may include, for example, silicon (Si) such as single-crystal silicon formed with a Czochralski process and/or an epitaxial process. The insulating layer 102 may include an insulating material and may not include a semiconductor material. The insulating layer 102 may include, for example, silicon oxide ($SiO_2$), but the technical spirit of inventive concepts are not limited thereto. The insulating layer 102 may be referred to as a buried oxide (BOX); however, example embodiments are not limited thereto.

The first doped layer 111 may be disposed on the substrate 100 in the first region I. For example, the first doped layer 111 may be disposed on the second layer 103 in the first region I. The first doped layer 111 may extend in a first direction DR1. The first doped layer 111 may include, e.g. may be doped, with a first impurity. The first impurity may be, for example, an n-type impurity such as at least one of phosphorus or arsenic.

The second doped layer 112 may be disposed on the substrate 100 in the second region II. For example, the second doped layer 112 may be disposed on the second layer 103 in the second region II. The second doped layer 112 may extend in the first direction DR1. The second doped layer 112 may include, e.g. may be doped with, a second impurity different from the first impurity. The second impurity may be, for example, a p-type impurity such as boron.

Either or both of the first impurity region 111 and the second impurity region 112 may be counter-doped, e.g. may be doped with small concentration of impurities other than a primary impurity included in the respective one of the first impurity region 111 and the second impurity region 112. For example, a concentration of first impurities in the first doped layer 111 may be larger than, e.g. larger by orders of magnitude than, a concentration of second impurities in the first doped layer 111. Alternatively or additionally, a concentration of second impurities in the second doped layer 112 may be larger than, e.g. larger by orders of magnitude than, a concentration of first impurities in the second doped layer 112. Furthermore either or both of the first impurity layer 111 and the second impurity layer 112 may include other impurities, such carbon and/or germanium. However, example embodiments are not limited thereto.

The element isolation layer 105 may be disposed on the substrate 100. The element isolation layer 105 may define a first lower pattern BP and a second lower pattern BP2 protruding from the second layer 103. The element isolation layer 105 may be disposed in an element isolation trench T1 extending into or at least partially into the second layer 103.

The element isolation layer 105 may contact each of the first doped layer 111, the second doped layer 112, the second layer 103, the insulating layer 102, and the first layer 101. The element isolation layer 105 may include or consist of at least one of, for example, a silicon oxide layer, a silicon nitride layer, or a silicon oxynitride layer.

The first lower pattern BP1 may include a part or a portion of the second layer 103, a part or a portion the insulating layer 102, a part or a portion the first layer 101, and the first doped layer 111 in the first region I. The first lower pattern BP1 may protrude from the second layer 103 in a vertical direction DR3. The first lower pattern BP1 may extend in the first direction DR1.

The second lower pattern BP2 may include a part or a portion of the second layer 103, a part or a portion the insulating layer 102, a part or a portion the first layer 101, and the second doped layer 112 in the second region II. The second lower pattern BP2 may protrude from the second layer 103 in the vertical direction DR3. The second lower pattern BP2 may extend in the first direction DR1.

The second lower pattern BP2 may be spaced apart from the first lower pattern BP1. Although FIG. 1 illustrates that the second lower pattern BP2 is spaced apart from the first lower pattern BP1 in the first direction DR1, this is for simplicity of description, and example embodiments are not limited thereto.

The first lower pattern BP1 and the second lower pattern BP1 may be separated by the element isolation layer 105. In more detail, the first doped layer 111 and the second doped layer 112 may be separated by the element isolation layer 105. The second layer 103 disposed in the first region I may be separated from/spaced apart from the second layer 103 disposed in the second region II. The insulating layer 102 disposed in the first region I may be separated from/spaced apart from the insulating layer 102 disposed in the second region II. The term "being separated" as used herein means being not in contact with or direct contact with each other.

A bottom surface 105a of the element isolation layer 105 may be formed inside the first layer 101. For example, the bottom surface 105a of the element isolation layer 105 may be formed lower than a bottom surface 102a of the insulating layer 102. A bottom surface 111a of the first doped layer 111 may be formed higher than the bottom surface 105a of the element isolation layer 105. In addition, a bottom surface 112a of the second doped layer 112 may be formed higher than the bottom surface 105a of the element isolation layer 105.

The top surface of the element isolation layer 105 may be formed on the same plane as the top surface of the first doped layer 111 and the top surface of the second doped layer 112. However, example embodiments are not limited thereto.

The first plurality of nanowires NW1 may be disposed on the first lower pattern BP1. For example, the first plurality of nanowires NW1 may be disposed on the first doped layer 111 in the first region I. The first plurality of nanowires NW1 may extend in the first direction DR1. The first plurality of nanowires NW1 may include a plurality of nanowires sequentially stacked to be spaced apart from each other in the vertical direction DR3.

The second plurality of nanowires NW2 may be disposed on the second lower pattern BP2. For example, the second plurality of nanowires NW2 may be disposed on the second doped layer 112 in the second region II. The second plurality of nanowires NW2 may extend in the first direction DR1. The second plurality of nanowires NW2 may include a plurality of nanowires sequentially stacked to be spaced apart from each other in the vertical direction DR3.

The second plurality of nanowires NW2 may be spaced apart from the first plurality of nanowires NW1. Although FIG. 1 illustrates that the second plurality of nanowires NW2 are spaced apart from the first plurality of nanowires NW1 in the first direction DR1, this is for simplicity of description, and example embodiments are not limited thereto.

Although FIG. 2 illustrates that the first plurality of nanowires NW1 include three nanowires and the second plurality of nanowires NW2 include three nanowires, this is for simplicity of description, and the technical spirit of inventive concepts are not limited thereto. For example, a number of the first plurality of nanowires NW1 may be more than three nanowires or less than three nanowires. A number of the second plurality of nanowires NW2 may be more than three nanowires or less than three nanowires. A number of the first plurality of nanowires NW1 may be the same as, or different from, a number of the second plurality of nanowires NW2.

The first gate structure 120 may be disposed on the substrate 100 in the first region I. The first gate structure 120 may extend in a second direction DR2 crossing, e.g. perpendicular to, the first direction DR1.

A first fin-cut gate structure 120_1 may be disposed on the substrate 100 in the first region I. The first fin-cut gate structure 120_1 may extend in the second direction DR2. The first fin-cut gate structure 120_1 may be spaced apart from the first gate structure 120 in the first direction DR1.

A second fin-cut gate structure 120_2 may be disposed on the substrate 100 in the first region I. The second fin-cut gate structure 120_2 may extend in the second direction DR2. The second fin-cut gate structure 120_2 may be spaced apart from the first gate structure 120 in the first direction DR1. For example, the first gate structure 120 may be disposed between the first fin-cut gate structure 120_1 and the second fin-cut gate structure 120_2.

All or at least a part of the first fin-cut gate structure 120_1 may overlap, in the vertical direction DR3, the element isolation layer 105 disposed on a first side of the first lower pattern BP1 in the first direction DR1. All or at least a part of the second fin-cut gate structure 120_2 may overlap, in the vertical direction DR3, the element isolation layer 105 disposed on a second side opposite to the first side of the first lower pattern BP1 in the first direction DR1.

The first gate structure 120 may partially or fully surround the first plurality of nanowires NW1. The first fin-cut gate structure 120_1 may entirely surround a first end of the first plurality of nanowires NW1. The second fin-cut gate structure 120_2 may entirely surround a second end opposite to the first end of the first plurality of nanowires NW1.

Each of the first gate structure 120, the first fin-cut gate structure 120_1, and the second fin-cut gate structure 120_2 may include a first gate electrode 121, a first gate insulating layer 122, a first capping pattern 123, a first external spacer 124, and a first internal spacer 125.

The first gate electrode 121 may be disposed on the substrate 100 in the first region I. The first gate electrode 121 may extend in the second direction DR2. The first gate electrode 121 may surround the first plurality of nanowires NW1.

The first gate electrode 121 may include or consist of, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. The first gate electrode 121 may include at least one of conductive metal oxide, conductive metal oxynitride or the like, and may include an oxidized form of the aforementioned material.

The first gate insulating layer 122 may be disposed along both sidewalls of the first gate electrode 121. The first gate insulating layer 122 may be disposed between the first doped layer 111 and the first gate electrode 121, between the element isolation layer 105 and the first gate electrode 121, and between the first plurality of nanowires NW1 and the first gate electrode 121. Alternatively or additionally, the first gate insulating layer 122 may be disposed between the first internal spacer 125 and the first gate electrode 121 and between the first external spacer 124 and the first gate electrode 121.

The first gate insulating layer 122 may include or consist of at least one of silicon oxide, silicon oxynitride, silicon nitride, or a high dielectric constant material having a higher dielectric constant than silicon oxide. The high dielectric constant material may include, for example, at least one selected from the group consisting of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

A semiconductor device according to some example embodiments may include a negative capacitance field effect transistor (NCFET) using a negative capacitor. For example, the first gate insulating layer 122 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor, for example because the harmonic average of the respective capacitances of each capacitor. On the other hand, when at least one of the capacitances of two or more capacitors connected in series has a negative value, the total capacitance may have a positive value and may be greater than the absolute value of each capacitance, for example based on the harmonic average of the respective capacitances of each capacitor.

When a ferroelectric material layer having a negative capacitance and a paraelectric material layer having a positive capacitance are connected in series, the total capacitance value of the ferroelectric material layer and the paraelectric material layer connected in series may increase. By using an increase in the total capacitance value, the transistor including the ferroelectric material layer may have a subthreshold swing (SS) less than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may or may not further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but are not limited thereto.

The ferroelectric material layer and the paraelectric material layer may include, e.g. may consist of, the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer may be different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 nm to 10 nm, but example embodiments are not limited thereto. Since a critical thickness at which each ferroelectric material exhibits ferroelectric properties may be different, the thickness of the ferroelectric material layer may vary depending on the ferroelectric material.

In some example embodiments, the first gate insulating layer 122 may include one ferroelectric material layer. In some example embodiments, the first gate insulating layer 122 may include a plurality of ferroelectric material layers spaced apart from each other. The first gate insulating layer 122 may have a laminated layer structure in which a plurality of ferroelectric material layers and a plurality of paraelectric material layers are alternately laminated.

The first capping pattern 123 may be disposed on the first gate electrode 121. Although it is illustrated that the first gate insulating layer 122 is not disposed between the first external spacer 124 and the first capping pattern 123, this is for simplicity of description, and example embodiments are not limited thereto.

Although it is depicted in FIG. 2 that the first capping pattern 123 is formed between the inner sidewalls of the first external spacer 124, example embodiments are not limited thereto. In some example embodiments, the top surface of the first external spacer 124 may be recessed down below the top surface of the first interlayer insulating layer 150 in the same manner as the first gate electrode 121. Accordingly, the first capping pattern 123 may be disposed on the top surface of the first external spacer 124 and the top surface of the first gate electrode 121.

The top surface of the first capping pattern 123 may be formed on the same plane as the top surface of the first interlayer insulating layer 150. The first capping pattern 123 may include, for example, a material having an etch selectivity with respect to the first interlayer insulating layer 150. The first capping pattern 123 may include, for example, at least one of silicon nitride (SiN), silicon oxynitride (SiON), silicon oxide (SiO$_2$), silicon carbonitride (SiCN), silicon oxycarbonitride (SiOCN), or a combination thereof.

The first external spacer 124 may extend in the second direction DR2 along the sidewall of the first gate electrode 121 on the uppermost surface of the first plurality of nanowires NW1. The first external spacer 124 may cross the first plurality of nanowires NW1.

A part of the first external spacer 124 included in the first fin-cut gate structure 120_1 may extend in the second direction DR2 along the sidewall of the first gate electrode 121 on the element isolation layer 105. In addition, a part of the first external spacer 124 included in the second fin-cut gate structure 120_2 may extend in the second direction DR2 along the sidewall of the first gate electrode 121 on the element isolation layer 105.

Although it is depicted in FIG. 2 that the first external spacer 124 is formed as a single layer, example embodiments are not limited thereto. That is, in some other embodiments, the first external spacer 124 may be formed as a multilayer.

The first external spacer 124 may include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC) or a combination thereof.

The first internal spacer 125 may be disposed between the first gate electrode 121 and the first source/drain region 141 between the first plurality of nanowires NW1. In addition, the first internal spacer 125 may be disposed between the lowermost surface of the first plurality of nanowires NW1 and the first doped layer 111.

The first internal spacer 125 may include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC) or a combination thereof.

The second gate structure 130 may be disposed on the substrate 100 in the second region II. The second gate structure 130 may extend in the second direction DR2.

The third fin-cut gate structure 130_1 may be disposed on the substrate 100 in the second region II. The third fin-cut gate structure 130_1 may extend in the second direction DR2. The third fin-cut gate structure 130_1 may be spaced apart from the second gate structure 130 in the first direction DR1.

The fourth fin-cut gate structure 130_2 may be disposed on the substrate 100 in the second region II. The fourth fin-cut gate structure 130_2 may extend in the second direction DR2. The fourth fin-cut gate structure 130_2 may be spaced apart from the second gate structure 130 in the first direction DR1. For example, the second gate structure 130 may be disposed between the third fin-cut gate structure 130_1 and the fourth fin-cut gate structure 130_2.

At least a part of the third fin-cut gate structure 130_1 may overlap, in the vertical direction DR3, the element isolation layer 105 disposed on a first side of the second lower pattern BP2 in the first direction DR1. At least a part of the fourth fin-cut gate structure 130_2 may overlap, in the vertical direction DR3, the element isolation layer 105 disposed on a second side opposite to the first side of the second lower pattern BP2 in the first direction DR1.

The second gate structure 130 may partially or completely surround the second plurality of nanowires NW2. The third fin-cut gate structure 130_1 may entirely surround a first end of the second plurality of nanowires NW2. The fourth fin-cut gate structure 130_2 may entirely surround a second end opposite to the first end of the second plurality of nanowires NW2.

Each of the second gate structure 130, the third fin-cut gate structure 130_1, and the fourth fin-cut gate structure 130_2 may include a second gate electrode 131, a second gate insulating layer 132, a second capping pattern 133, a second external spacer 134, and a second internal spacer 135.

The second gate electrode 131, the second gate insulating layer 132, the second capping pattern 133, the second external spacer 134, and the second internal spacer 135 may have structures similar to those of the first gate electrode 121, the first gate insulating layer 122, the first capping pattern 123, the first external spacer 124, and the first internal spacer 125, respectively. Accordingly, detailed descriptions of the second gate electrode 131, the second gate insulating layer 132, the second capping pattern 133, the second external spacer 134, and the second internal spacer 135 are omitted.

The first source/drain region 141 may be disposed on at least one side of the first gate structure 120 on the first lower pattern BP1. For example, the first source/drain region 141 may be disposed between the first gate structure 120 and the first fin-cut gate structure 120_1 and between the first gate structure 120 and the second fin-cut gate structure 120_2 on the first lower pattern BP1. The first source/drain region 141 may contact the first plurality of nanowires NW1. At least a part of the first source/drain region 141 may extend into the first doped layer 111. However, the example embodiments are not limited thereto.

Although it is depicted in FIG. 2 that the top surface of the first source/drain region 141 is formed on the same plane as the uppermost surface of the first plurality of nanowires NW1, example embodiments are not limited thereto. In some example embodiments, the top surface of the first source/drain region 141 may be formed higher than the uppermost surface of the first plurality of nanowires NW1.

The second source/drain region 142 may be disposed on at least one side of the second gate structure 130 on the second lower pattern BP2. For example, the second source/drain region 142 may be disposed between the second gate structure 130 and the third fin-cut gate structure 130_1 and between the second gate structure 130 and the fourth fin-cut gate structure 130_2 on the second lower pattern BP2. The second source/drain region 142 may contact the second plurality of nanowires NW2. At least a part of the second source/drain region 142 may extend into the second doped layer 112. However, example embodiments are not limited thereto.

Although it is depicted in FIG. 2 that the top surface of the second source/drain region 142 is formed on the same plane as the uppermost surface of the second plurality of nanowires NW2, the example embodiments are not limited thereto. In some example embodiments, the top surface of the second source/drain region 142 may be formed higher than the uppermost surface of the second plurality of nanowires NW2.

The first interlayer insulating layer 150 may be disposed to cover the element isolation layer 105, the first source/drain region 141 and the second source/drain region 142. The top surface of the first interlayer insulating layer 150 may be formed on the same plane as the top surface of the first gate structure 120 and the top surface of the second gate structure 130. The second interlayer insulating layer 160 may be disposed to cover the first capping pattern 123, the second capping pattern 133, and the first interlayer insulating layer 150.

Each of the first interlayer insulating layer 150 and the second interlayer insulating layer 160 may contain, e.g., at least one of silicon oxide, silicon nitride, silicon nitride, or a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SILK, amorphous fluorinated carbon, silica aerogels, silica xerogels, mesoporous silica, or a combination thereof, but example embodiments are not limited thereto.

The first source/drain contact 171 may penetrate the second interlayer insulating layer 160 and the first interlayer insulating layer 150 in the vertical direction DR3 to extend into the first source/drain region 141. The first source/drain contact 171 may penetrate the second interlayer insulating layer 160 and the first interlayer insulating layer 150 in the vertical direction DR3 to extend into the second source/drain region 142.

The silicide layer 175 may be disposed between the first source/drain region 141 and the first source/drain contact 171. The silicide layer 175 may be disposed along the profile of an interface between the first source/drain region 141 and the first source/drain contact 171. In addition, the silicide layer 175 may be disposed between the second source/drain region 142 and the second source/drain contact 172. The silicide layer 175 may be disposed along the profile of an interface between the second source/drain region 142 and the second source/drain contact 172. The silicide layer 175 may include or consist of, for example, a metal silicide material (and/or metal salicide material).

In the semiconductor device according to some embodiments of inventive concepts, a doped layer is formed in each of the NMOS region and the PMOS region on the SOI substrate, and the doped layer of the NMOS region is completely separated from the doped layer of the PMOS region using the element isolation layer, thereby reducing the occurrence of a leakage current, for example of a leakage current between components of the NMOS region and components of the PMOS region.

Hereinafter, a semiconductor device according to some example embodiments of inventive concepts will be described with reference to FIG. 4. Differences from the semiconductor device shown in FIGS. 1 to 3 will be mainly described.

Figure 4:
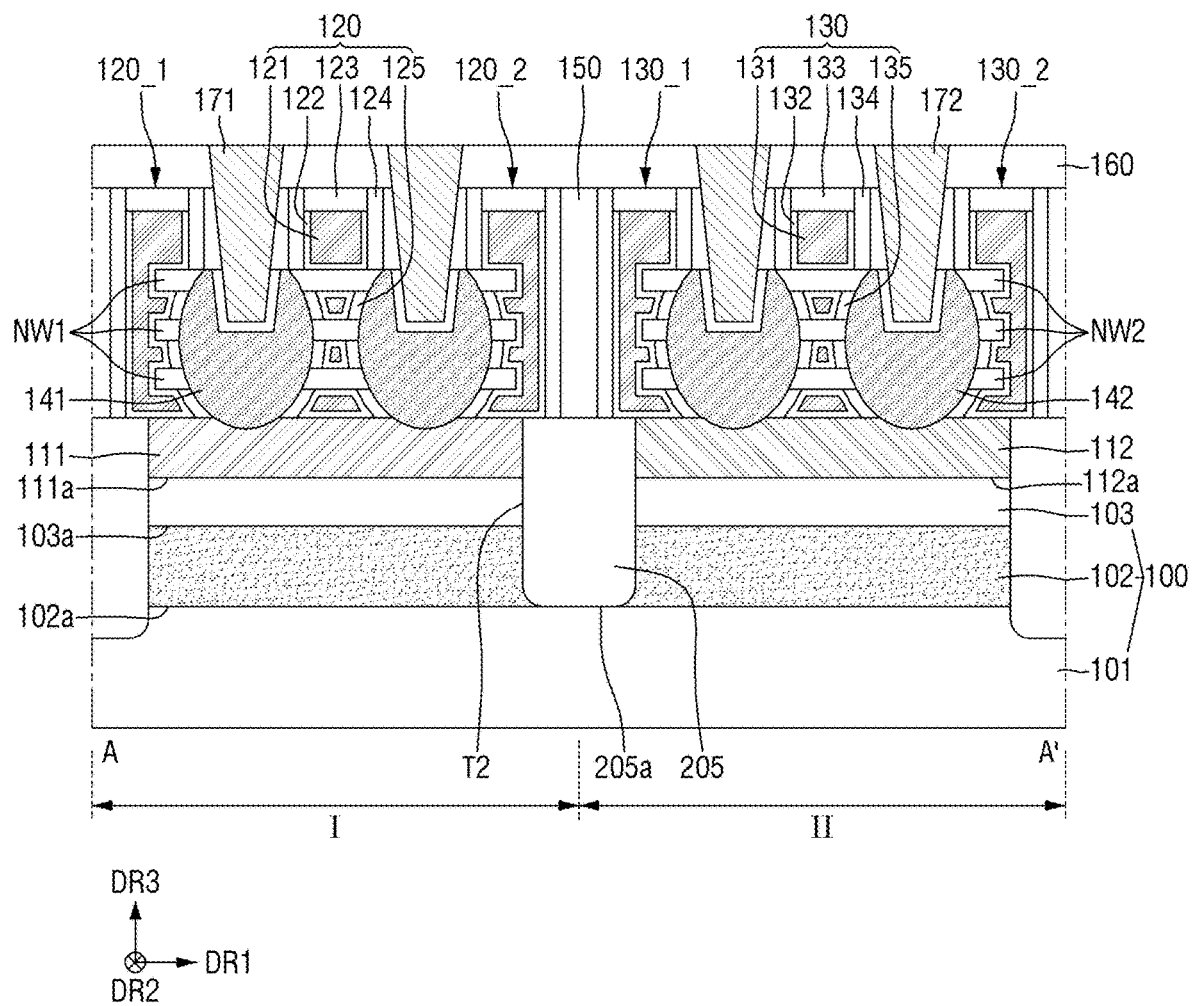
FIG. 4 is a cross-sectional view illustrating a semiconductor device according to some other embodiments of inventive concepts.

FIG. 4 is a cross-sectional view illustrating a semiconductor device according to some example embodiments of inventive concepts.

Referring to FIG. 4, in the semiconductor device according to some other embodiments of inventive concepts, an element isolation trench T2 may extend to a bottom surface 102a of an insulating layer 102. An element isolation layer 205 may be disposed in the element isolation trench T2.

A bottom surface 205a of the element isolation layer 205 may be formed on the same plane as the bottom surface 102a of the insulating layer 102. The element isolation layer 205 may completely separate the first doped layer 111 from the second doped layer 112. The element isolation layer 205 may completely separate the second layer 103 disposed in the first region I from the second layer 103 disposed in the second region II. The element isolation layer 205 may completely separate the insulating layer 102 disposed in the first region I from the insulating layer 102 disposed in the second region II.

Hereinafter, a semiconductor device according to still other embodiments of inventive concepts will be described with reference to FIG. 5. Hereinafter, a semiconductor device according to still other embodiments of inventive concepts will be described with reference to FIG. 5.

Figure 5:
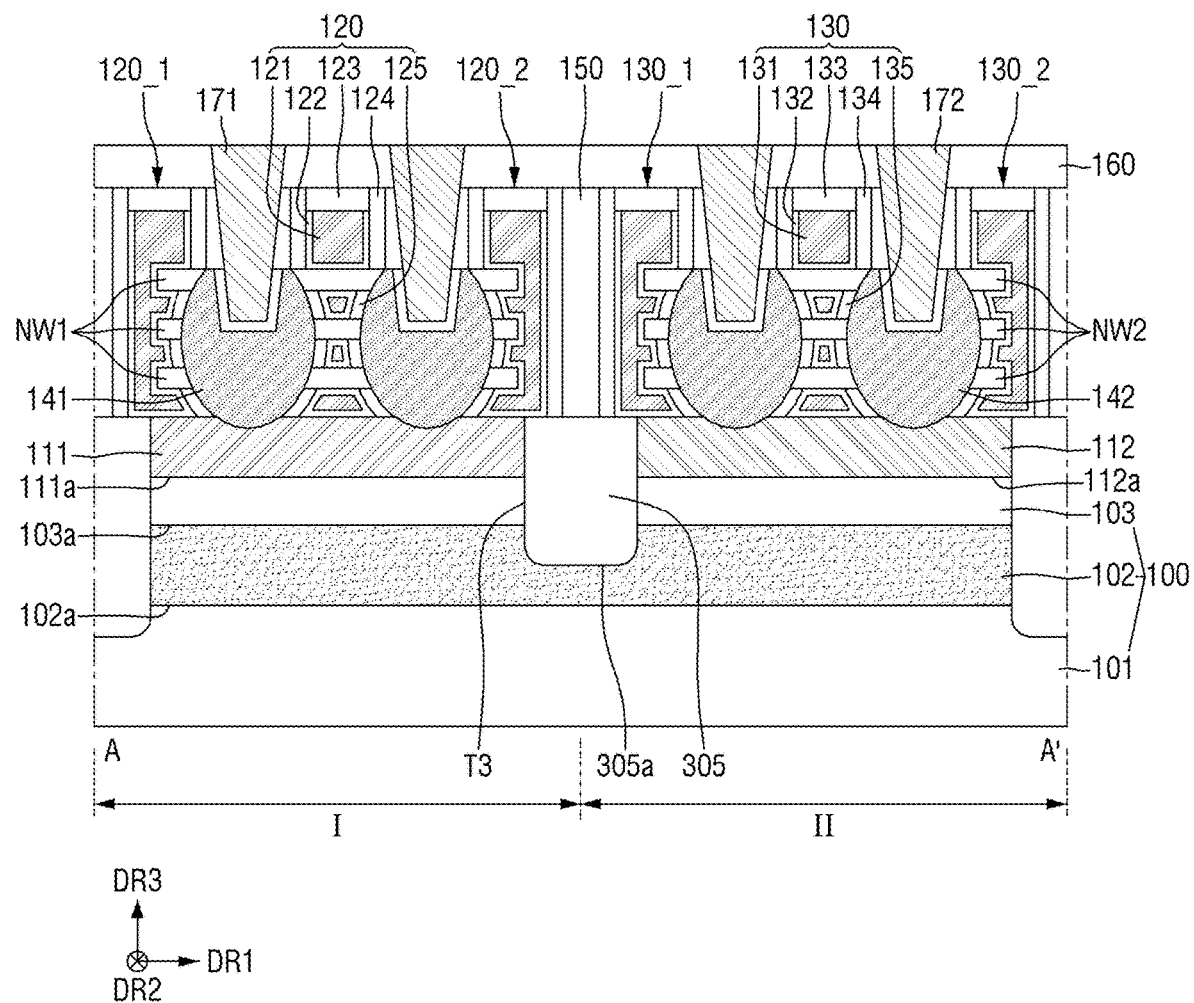
FIG. 5 is a cross-sectional view illustrating a semiconductor device according to still other embodiments of inventive concepts.

FIG. 5 is a cross-sectional view illustrating a semiconductor device according to still other embodiments of inventive concepts.

Referring to FIG. 5, in the semiconductor device according to some example embodiments of inventive concepts, an element isolation trench T3 may extend into the insulating layer 102. An element isolation layer 305 may be disposed in the element isolation trench T3.

A bottom surface 305a of the element isolation layer 305 may be formed inside the insulating layer 102. The element isolation layer 305 may completely separate the first doped layer 111 from the second doped layer 112. The element isolation layer 305 may completely separate the second layer 103 disposed in the first region I from the second layer 103 disposed in the second region II. The insulating layer 102 disposed in the first region I and the insulating layer 102 disposed in the second region II may be connected under the element isolation layer 305.

Hereinafter, a semiconductor device according to still other embodiments of inventive concepts will be described with reference to FIG. 6. Differences from the semiconductor device shown in FIGS. 1 to 3 will be mainly described.

Figure 6:
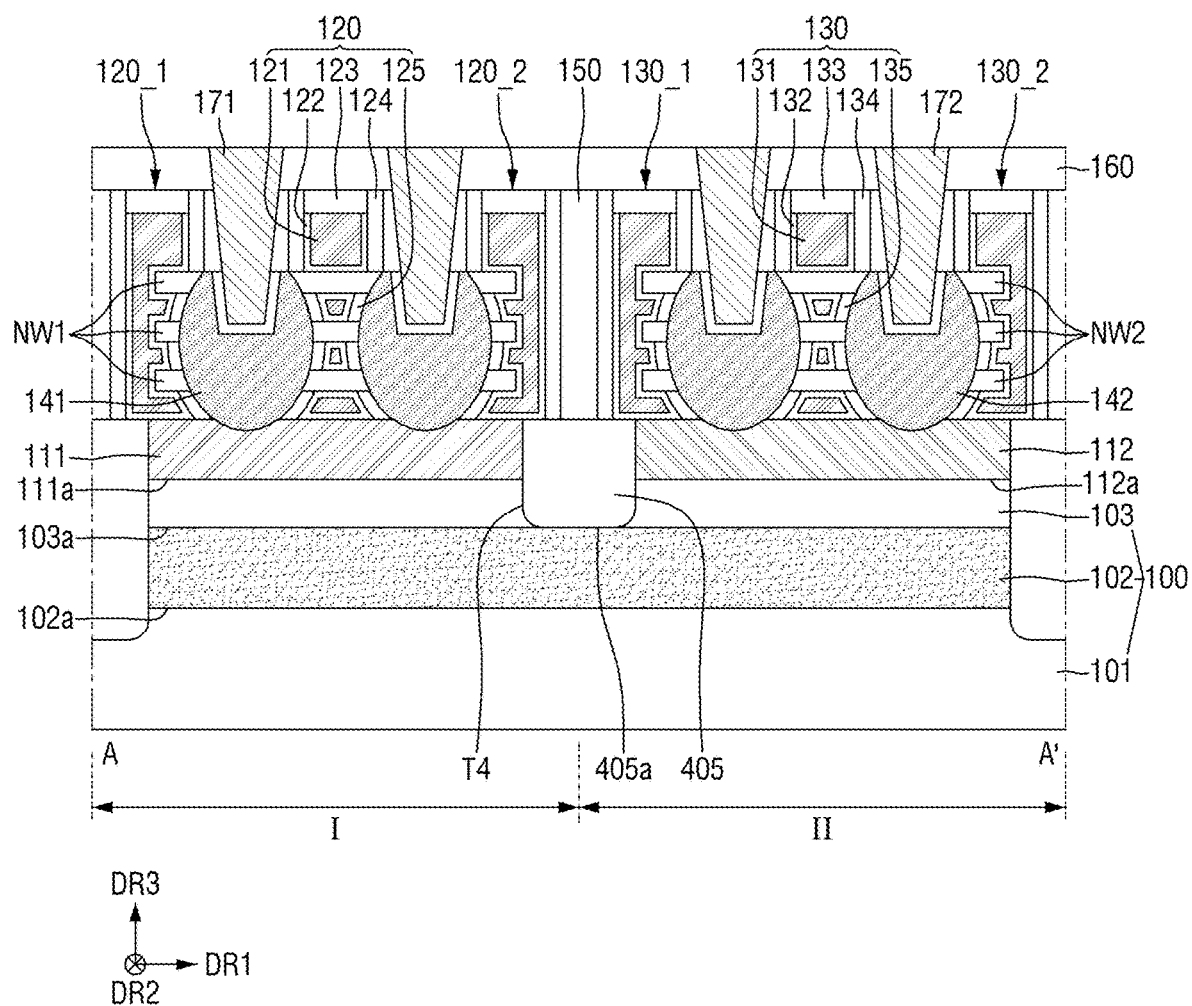
FIG. 6 is a cross-sectional view illustrating a semiconductor device according to some other embodiments of inventive concepts.

FIG. 6 is a cross-sectional view illustrating a semiconductor device according to some other embodiments of inventive concepts.

Referring to FIG. 6, in the semiconductor device according to some example embodiments of inventive concepts, an element isolation trench T4 may extend to a bottom surface 103a of the second layer 103. An element isolation layer 405 may be disposed in the element isolation trench T3.

A bottom surface 405a of the element isolation layer 405 may be formed on the same plane as the bottom surface 103a of the second layer 103. The element isolation layer 405 may completely separate the first doped layer 111 from the second doped layer 112. The element isolation layer 405 may completely separate the second layer 103 disposed in the first region I from the second layer 103 disposed in the second region II.

Hereinafter, a semiconductor device according to some example embodiments of inventive concepts will be described with reference to FIG. 7. Differences from the semiconductor device shown in FIGS. 1 to 3 will be mainly described.

Figure 7:
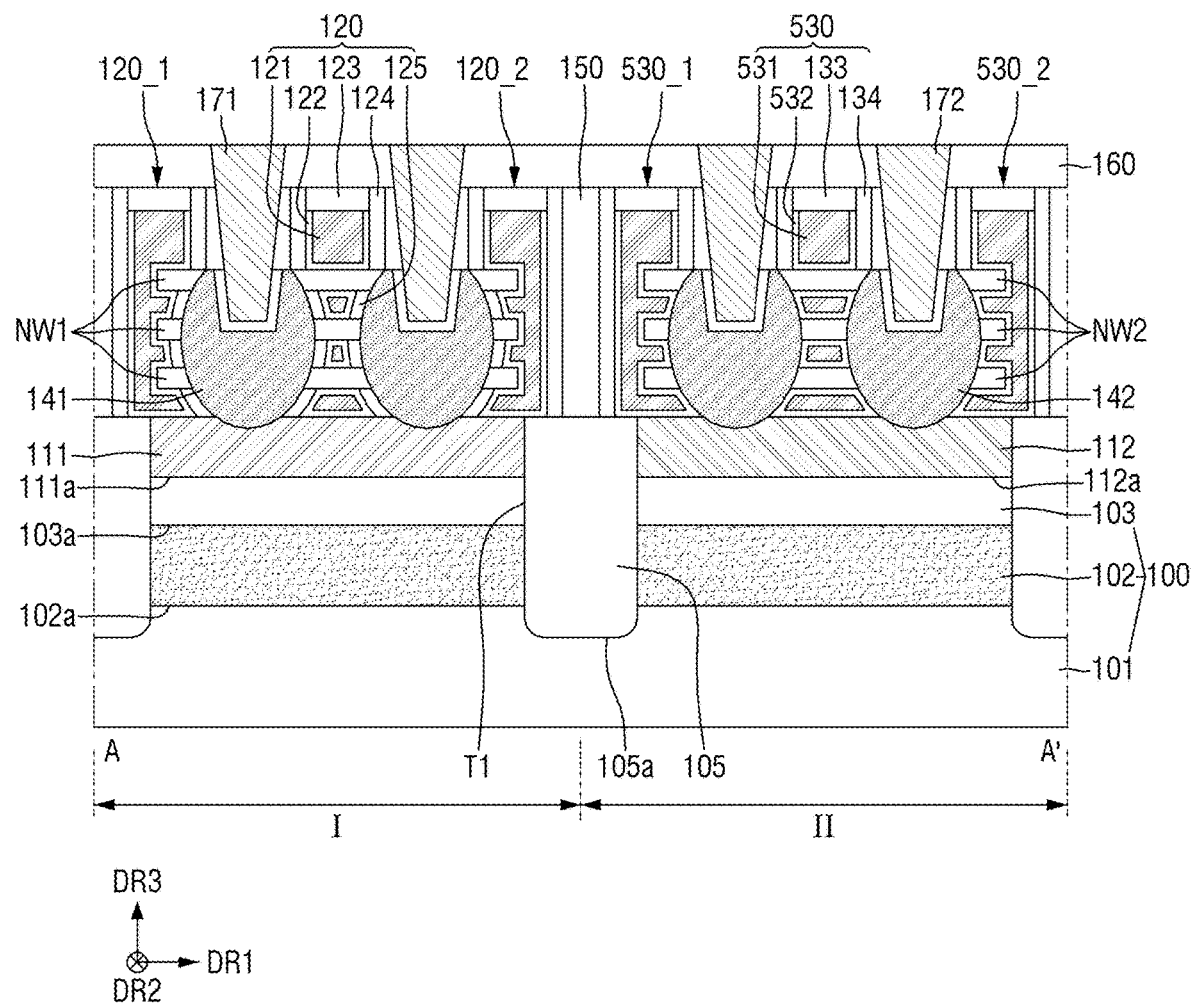
FIG. 7 is a cross-sectional view illustrating a semiconductor device according to still other embodiments of inventive concepts.

FIG. 7 is a cross-sectional view illustrating a semiconductor device according to still other embodiments of inventive concepts.

Referring to FIG. 7, in the semiconductor device according to still other embodiments of inventive concepts, an internal spacer is not disposed in a second region II, which may be a PMOS region.

Each of the second gate structure 530, the third fin-cut gate structure 530_1, and the fourth fin-cut gate structure 530_2 may include a second gate electrode 531, a second gate insulating layer 532, a second capping pattern 133, and a second external spacer 134. The second gate insulating layer 532 may contact the second source/drain region 142.

Hereinafter, a semiconductor device according to some example embodiments of inventive concepts will be described with reference to FIG. 8. Differences from the semiconductor device shown in FIGS. 1 to 3 will be mainly described.

Figure 8:
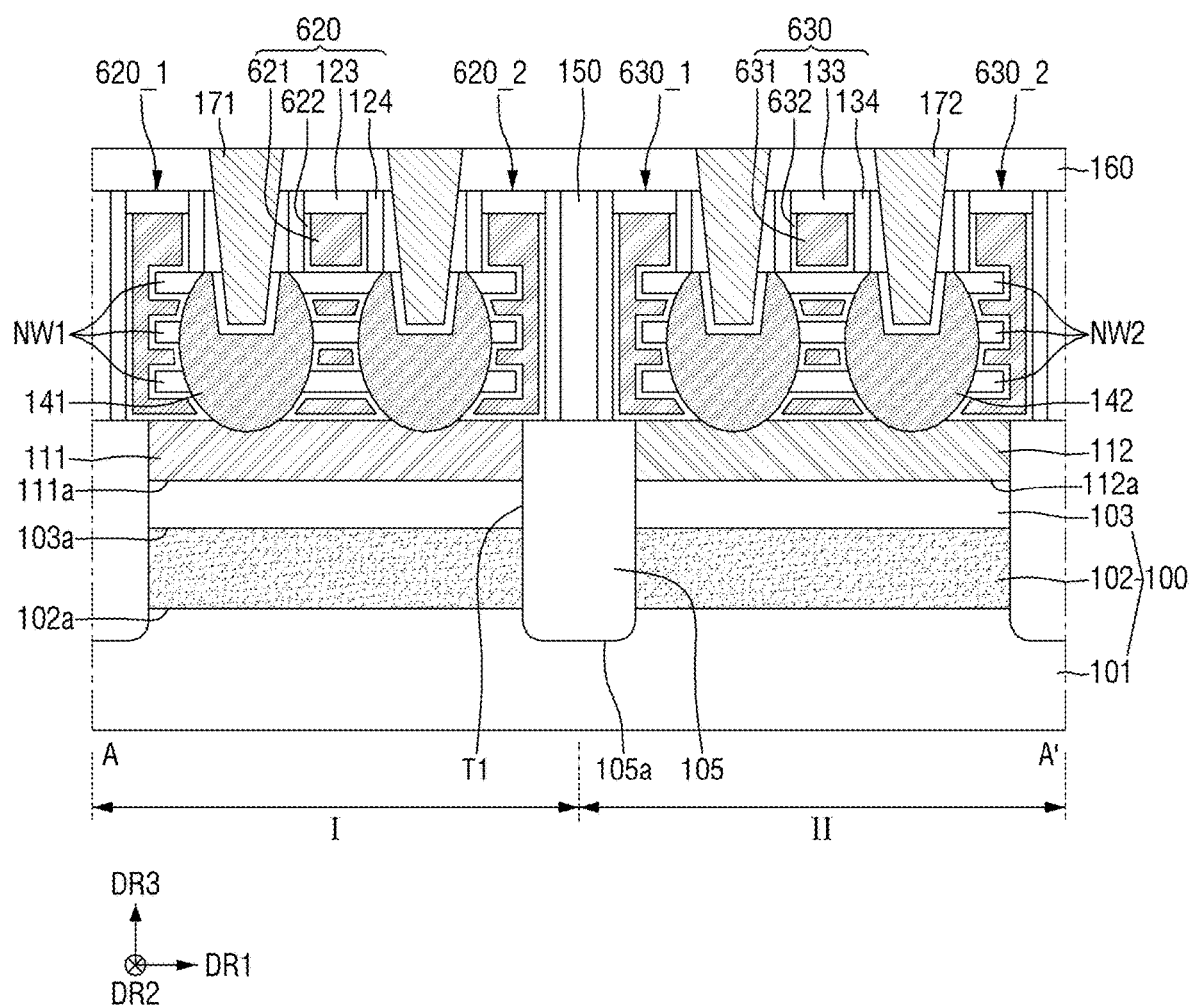
FIG. 8 is a cross-sectional view illustrating a semiconductor device according to still other embodiments of inventive concepts.

FIG. 8 is a cross-sectional view illustrating a semiconductor device according to still other embodiments of inventive concepts.

Referring to FIG. 8, in the semiconductor device according to some example embodiments of inventive concepts, an internal spacer is not disposed in each of the first region I which may be an NMOS region and the second region II which may be a PMOS region.

Each of a first gate structure 620, a first fin-cut gate structure 620_1, and a second fin-cut gate structure 620_2 may include a first gate electrode 621, a first gate insulating layer 622, a first capping pattern 123, and a first external spacer 124. A first gate insulating layer 662 may contact the first source/drain region 141.

Each of the second gate structure 630, the third fin-cut gate structure 630_1, and the fourth fin-cut gate structure 630_2 may include a second gate electrode 631, a second gate insulating layer 632, the second capping pattern 133, and the second external spacer 134. The second gate insulating layer 632 may contact the second source/drain region 142.

Example embodiments are not limited to those discussed above. Furthermore each of the above example embodiments is not necessarily mutually exclusive to one another. For example, some example embodiments may include features disclosed and discussed with reference to one figure, and may also include features disclosed and discussed with reference to another figure.

Hereinafter, a method for fabricating a semiconductor device according to some embodiments of inventive concepts will be described with reference to FIGS. 2 and 9 to 18.

Figure 9:
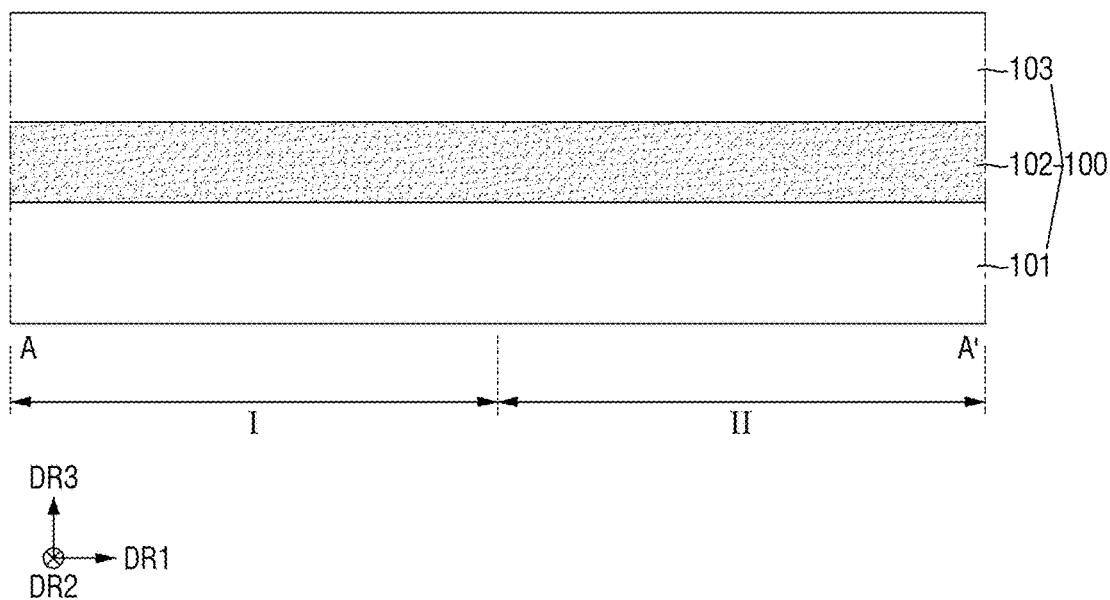
FIGS. 9 to 18 illustrate intermediate steps of a method for fabricating a semiconductor device according to some embodiments of inventive concepts.

Referring to FIG. 9, the substrate 100 may be formed over the first region I that is or may be an NMOS region and the second region II that is or may be a PMOS region. The substrate 100 may be an SOI substrate. For example, the substrate 100 may include the first layer 101, the BOX/insulating layer 102 disposed on the first layer 101, and the second layer 103 disposed on the insulating layer 102.

Each of the first layer 101 and the second layer 103 may include, for example, silicon (Si) such as single-crystal silicon that may or may not be lightly doped. The insulating layer 102 may include or consist of an insulating material, for example, silicon oxide ($SiO_2$). The substrate 100 may be formed with a process for forming an SOS substrate, such as a SIMOX process and/or a wafer bonding process and/or a seed method; however, example embodiments are not limited thereto.

Figure 10:
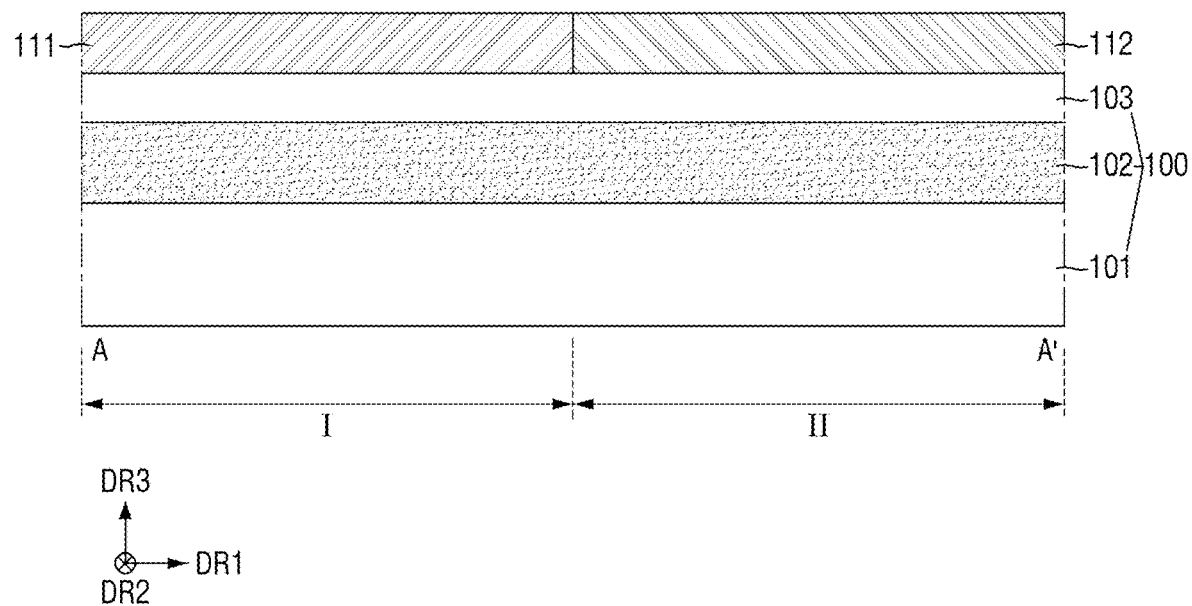

Referring to FIG. 10, the first doped layer 111 and the second doped layer 112 may be formed in the second layer 103. The first doped layer 111 may be formed inside the second layer 103 in the first region I. The first doped layer 111 may be formed by doping, e.g. ion implanting, a p-type impurity such as boron into the second layer 103 in the first region I. The second doped layer 112 may be formed inside the second layer 103 in the second region II. The second doped layer 112 may be formed by doping, e.g. ion implanting, an n-type impurity such as at least one of phosphorus or arsenic, into the second layer 103 in the second region II.

In FIG. 10, the first doped layer 111 and the second doped layer 112 are shown to be in contact with each other, but example embodiments are not limited thereto. In some example embodiments, the first doped layer 111 and the second doped layer 112 may be spaced apart from each other. For example, the second layer 103 may be disposed between the first doped layer 111 and the second doped layer 112.

Figure 11:
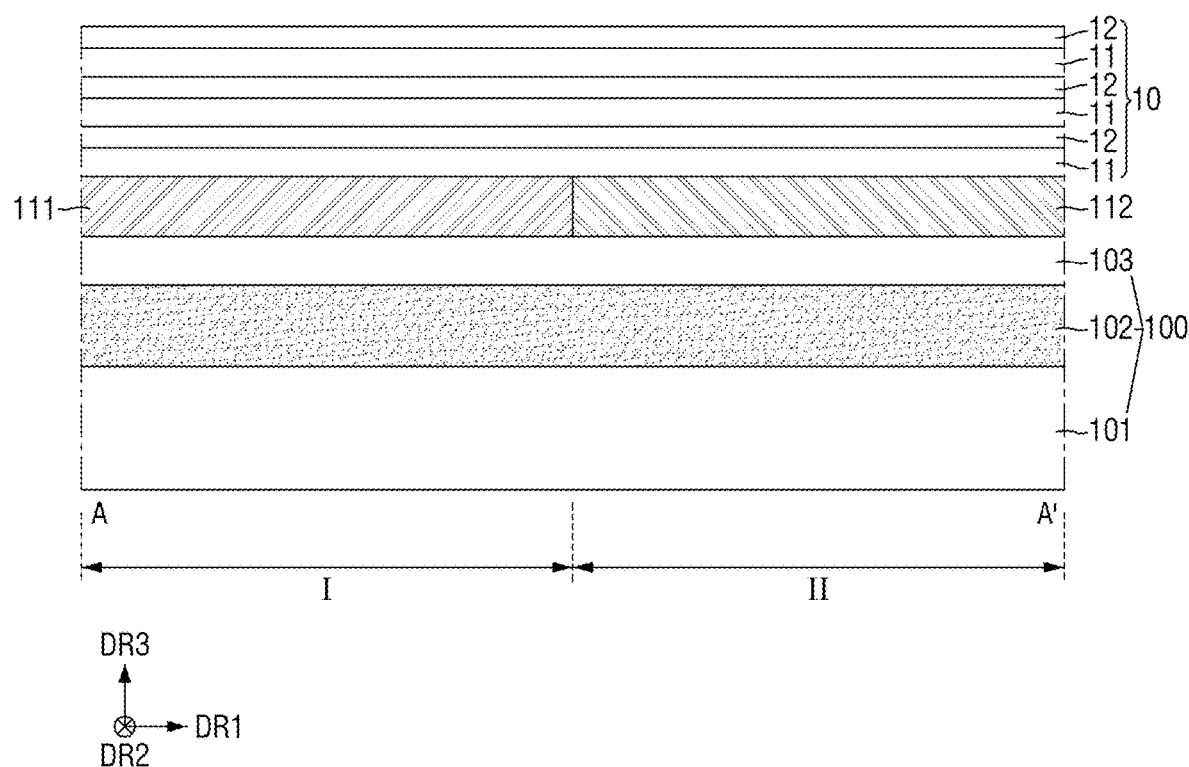

Referring to FIG. 11, a stacked structure 10 in which a first semiconductor layer 11 and a second semiconductor layer 12 are alternately stacked may be formed on the first doped layer 111 and the second doped layer 112. For example, the first semiconductor layer 11 may be formed at the lowermost portion of the stacked structure 10, and the second semiconductor layer 12 may be formed at the uppermost portion of the stacked structure 10. However, example embodiments are not limited thereto. The stacked structure 10 may be formed with, for example, an atomic layer deposition (ALD) process; however, example embodiments are not limited thereto.

The first semiconductor layer 11 may include, for example, silicon (Si). The second semiconductor layer 12 may include, for example, silicon germanium (SiGe).

Figure 12:
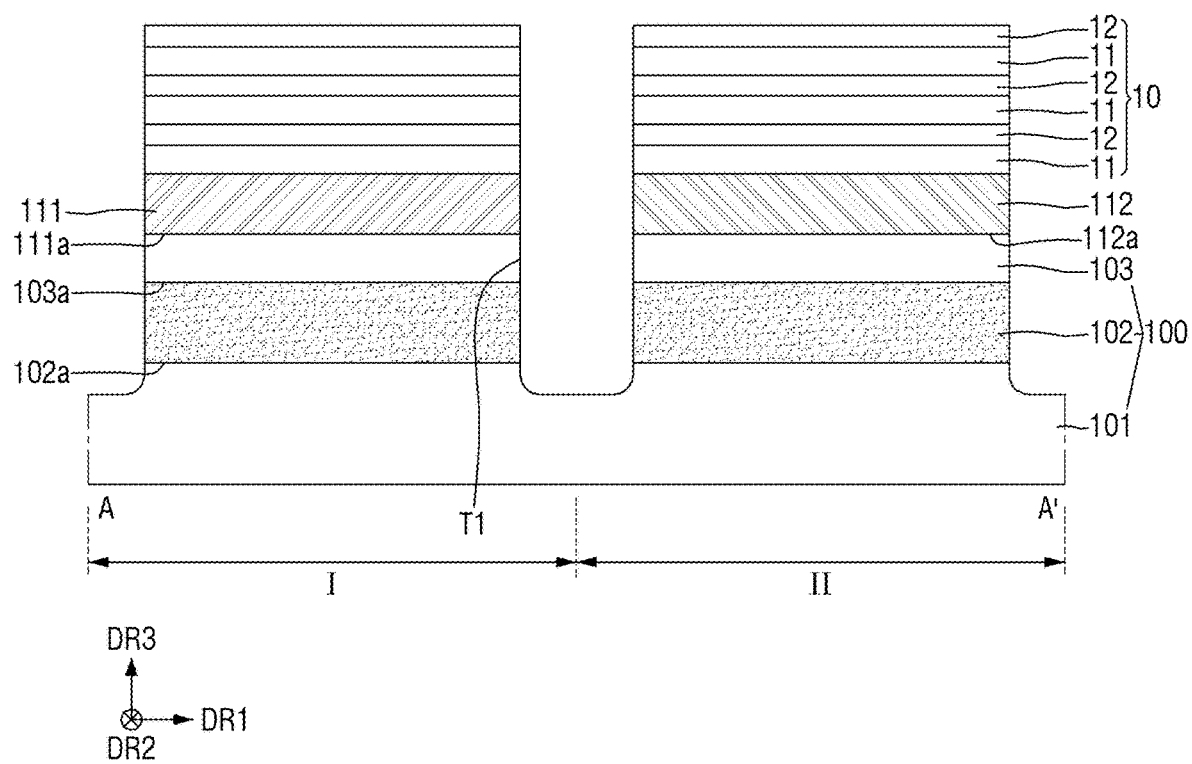

Referring to FIG. 12, the element isolation trench T1 may be formed by etching, e.g. by dry etching and/or wet etching, the stacked structure 10, a part of the first doped layer 111, a part of the second doped layer 112, the second layer 103, and the insulating layer 102 in the vertical direction DR3.

The element isolation trench T1 may be formed at a boundary portion between the first doped layer 111 and the second doped layer 112. For example, the element isolation trench T1 may be formed at a boundary portion between the first region I and the second region II. The element isolation trench T1 may extend into the first layer 101.

Figure 13:
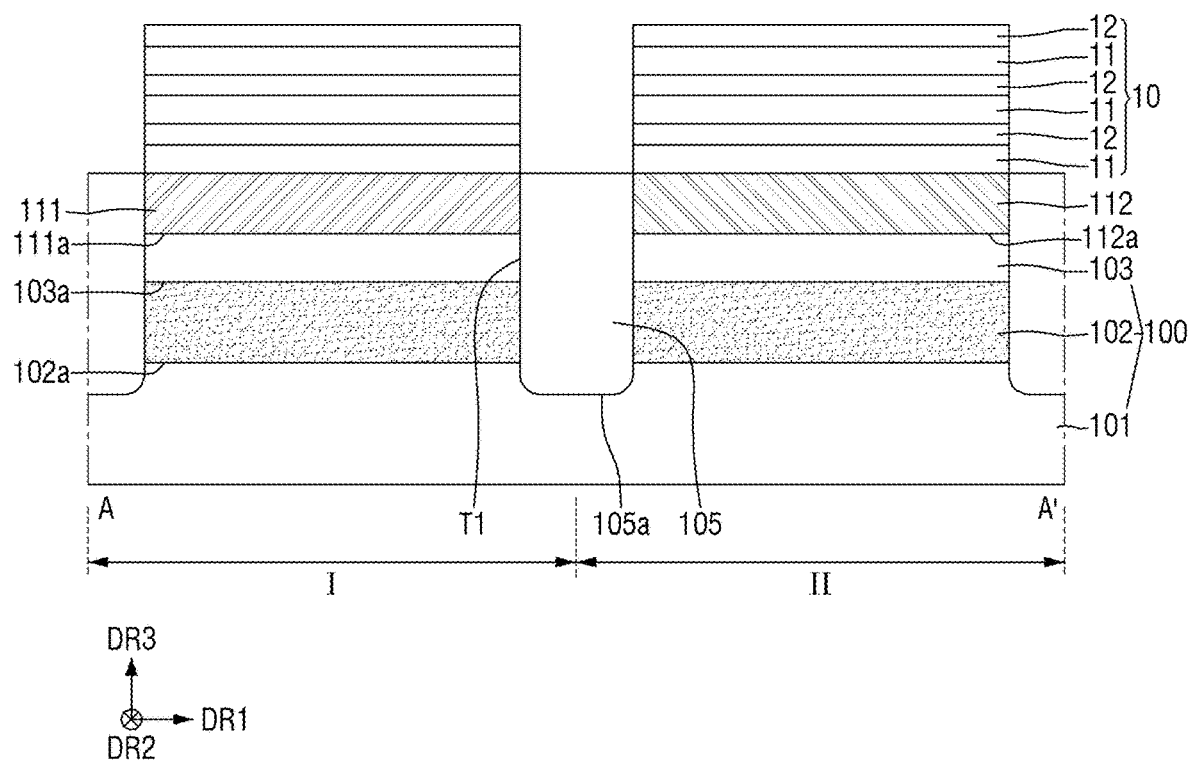

Referring to FIG. 13, the element isolation layer 105 may be formed in the element isolation trench T1. The bottom surface 105a of the element isolation layer 105 may be formed inside the first layer 101. For example, the bottom surface 105a of the element isolation layer 105 may be formed lower than each of the bottom surface 111a of the first doped layer 111, the bottom surface 112a of the second doped layer 112, and the bottom surface 102a of the insulating layer 102. The element isolation layer 105 may be formed with a chemical vapor deposition (CVD) process; however, example embodiments are not limited thereto.

Figure 14:
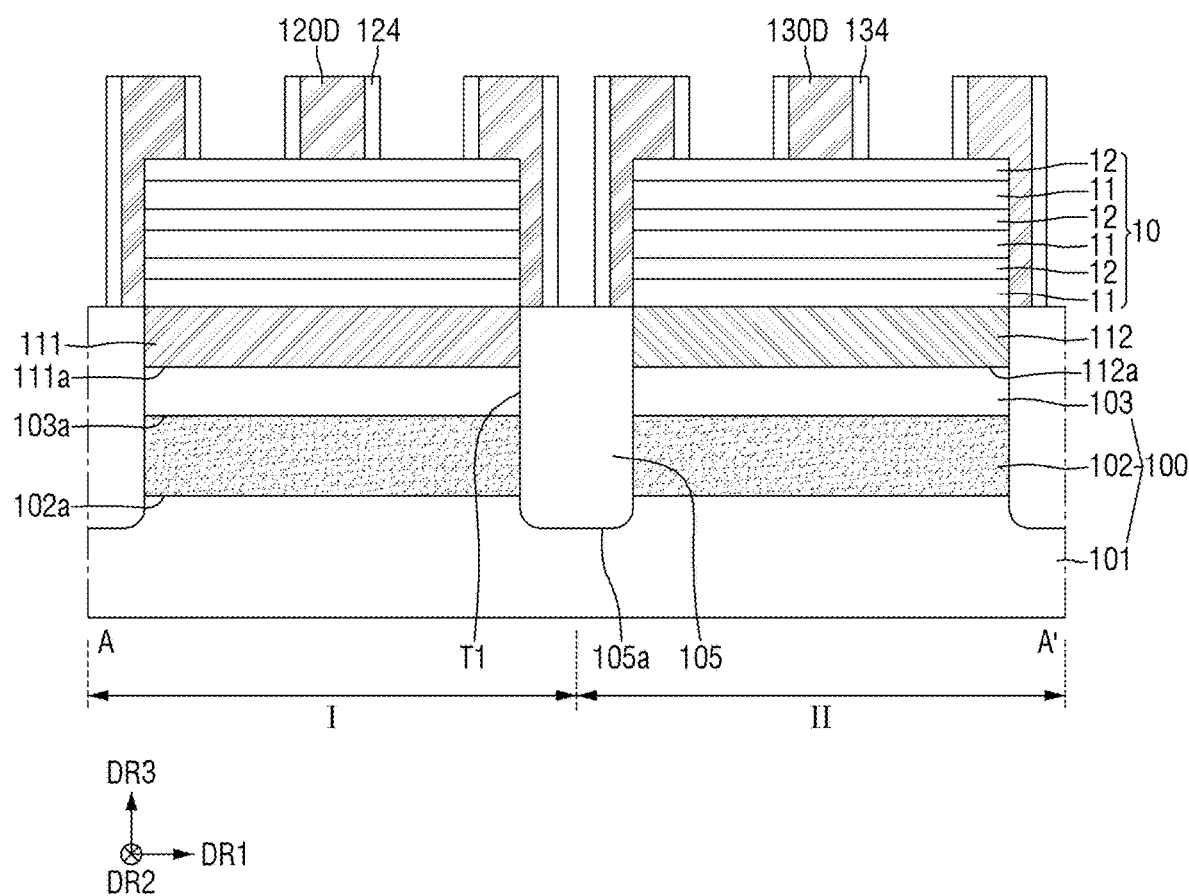

Referring to FIG. 14, a first dummy gate 120D and a second dummy gate 130D may be formed on the stacked structure 10. The first dummy gate 120D may be formed on the stacked structure 10 formed in the first region I. A part of the first dummy gate 120D may be formed on the element isolation layer 105 formed on both sides of the first doped layer 111 in the first direction DR1. The second dummy gate 130D may be formed on the stacked structure 10 formed in the second region II. A part of the second dummy gate 130D may be formed on the element isolation layer 105 formed on both sides of the second doped layer 112 in the first direction DR1.

Subsequently, the first external spacer 124 may be formed along the sidewall of the first dummy gate 120D, and the second external spacer 134 may be formed along the sidewall of the second dummy gate 130D.

Figure 15:
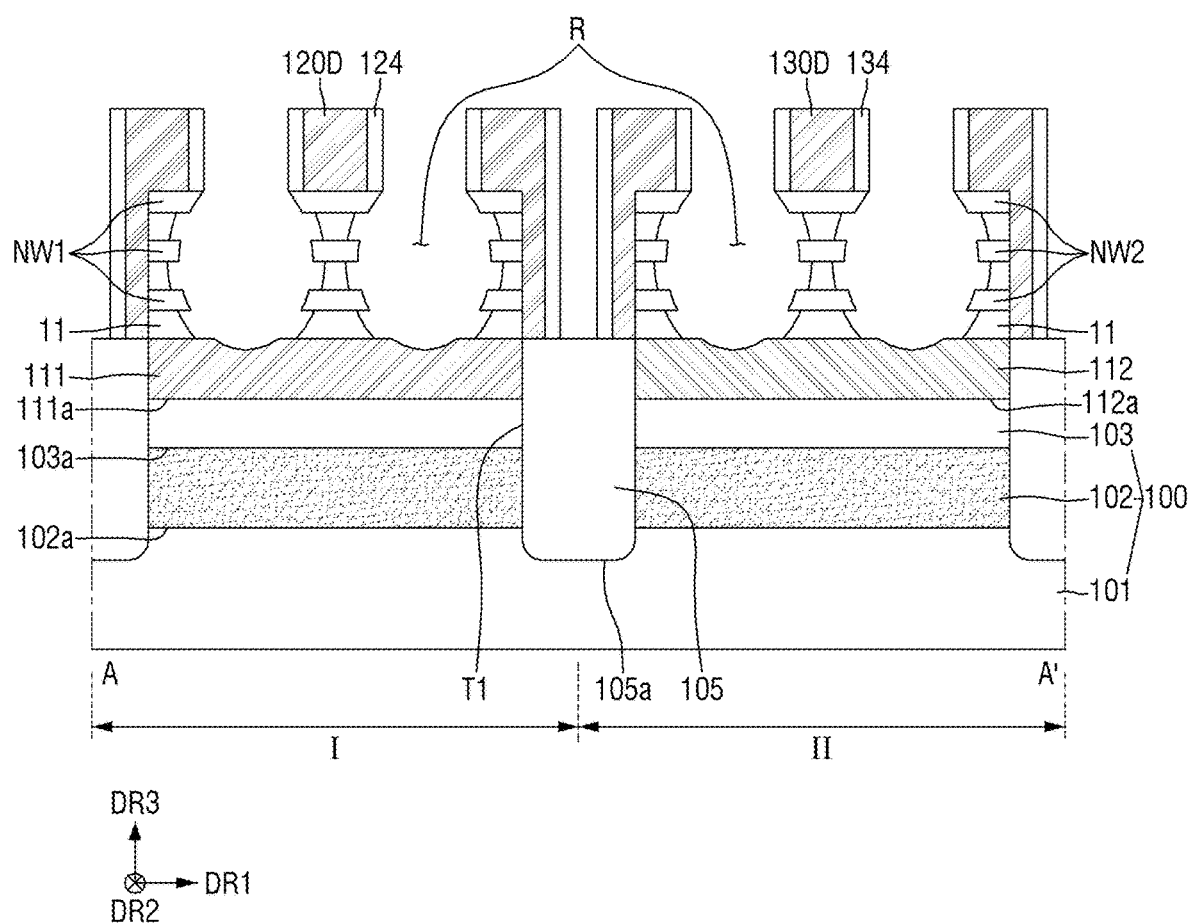

Referring to FIG. 15, a recess R may be formed on the first doped layer 111 by etching the stacked structure 10 using the first dummy gate 120D and the first external spacer 124 as a mask. In addition, the recess R may be formed on the second doped layer 112 by etching the stacked structure 10 using the second dummy gate 130D and the second external spacer 134 as a mask. In this case, a part of the first semiconductor layer 11 may be etched. The etching may be an isotropic etching such as a wet etching; however, example embodiments are not limited thereto.

The recess R may extend into each of the first doped layer 111 and the second doped layer 112, for example. However, example embodiments are not limited thereto.

The second semiconductor layer 12 etched under the first dummy gate 120D may be defined as the first plurality of nanowires NW1. In addition, the second semiconductor layers 12 etched under the second dummy gate 130D may be defined as the second plurality of nanowires NW2.

Figure 16:
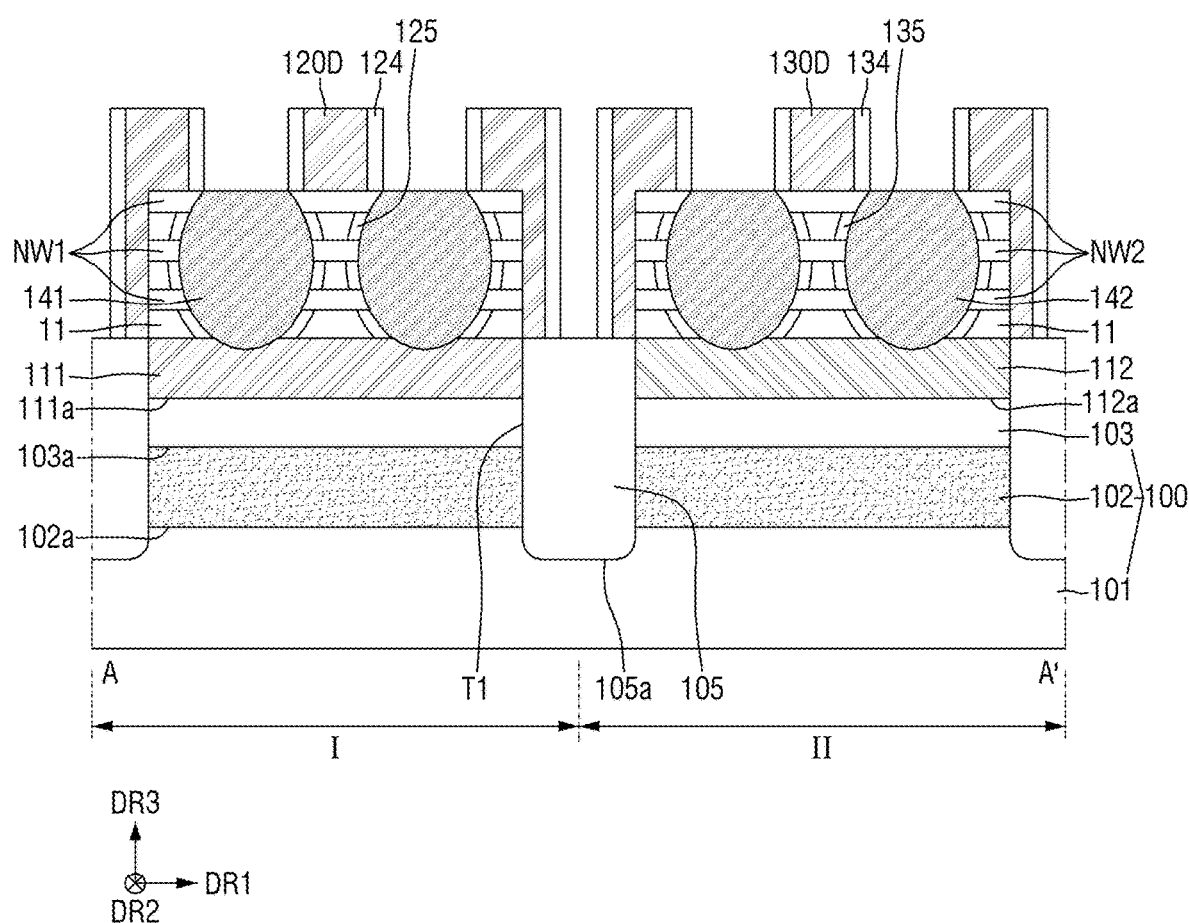

Referring to FIG. 16, the first internal spacer 125 may be formed in a portion where a part of the first semiconductor layer 11 is etched in the first region I. In addition, the second internal spacer 135 may be formed in a portion of the first semiconductor layer 11 where a part of the first semiconductor layer 11 is etched in the second region II.

Subsequently, the first source/drain region 141 may be formed in the recess R formed in the first region I. In addition, the second source/drain region 142 may be formed in the recess R formed in the second region II. The first source/drain region 141 and the second source/drain region 142 may be formed, for example, with a CVD process such as with an epitaxial CVD process; however, example embodiments are not limited thereto.

Figure 17:
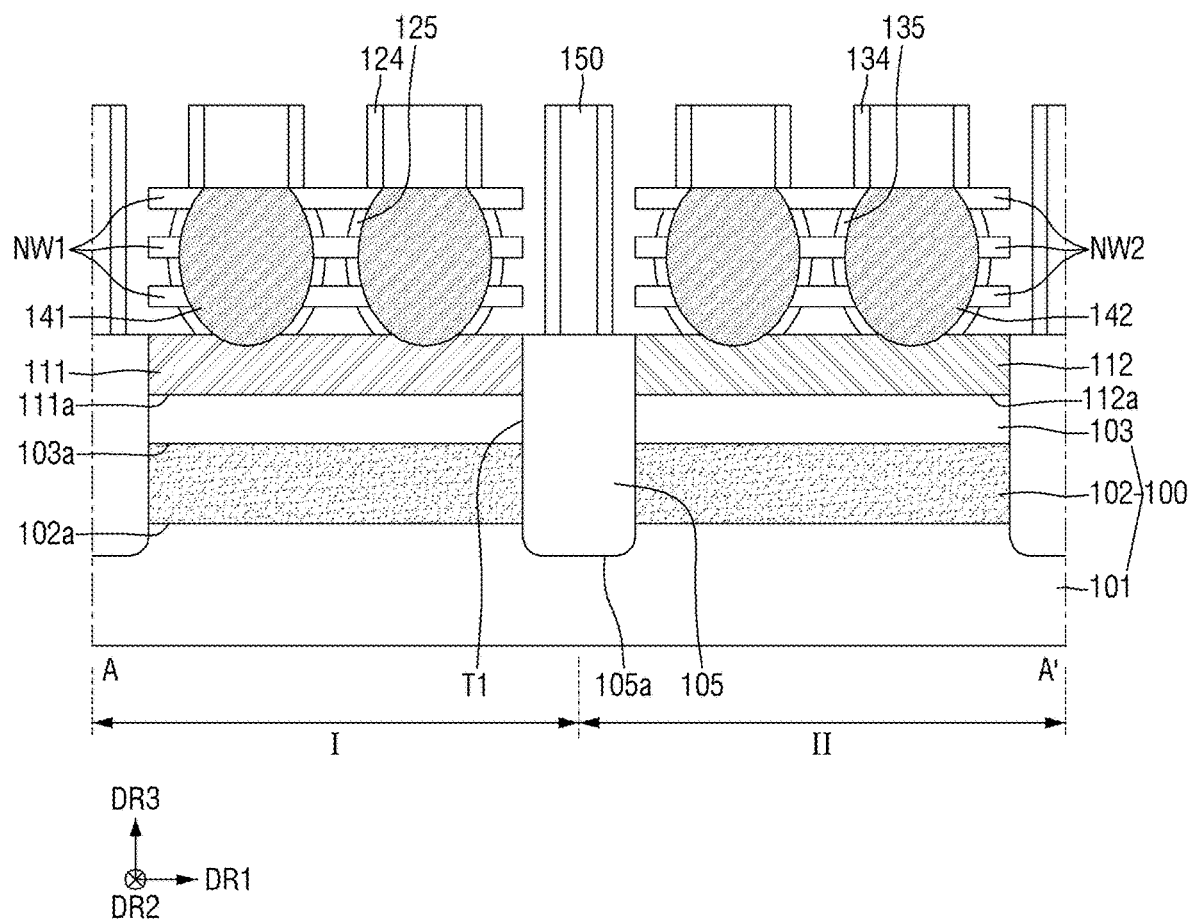

Referring to FIG. 17, the first interlayer insulating layer 150 may be formed to cover the element isolation layer 105, the first source/drain region 141, and the second source/drain region 142. Subsequently, each of the first dummy gate 120D and the second dummy gate 130D may be removed.

Figure 18:
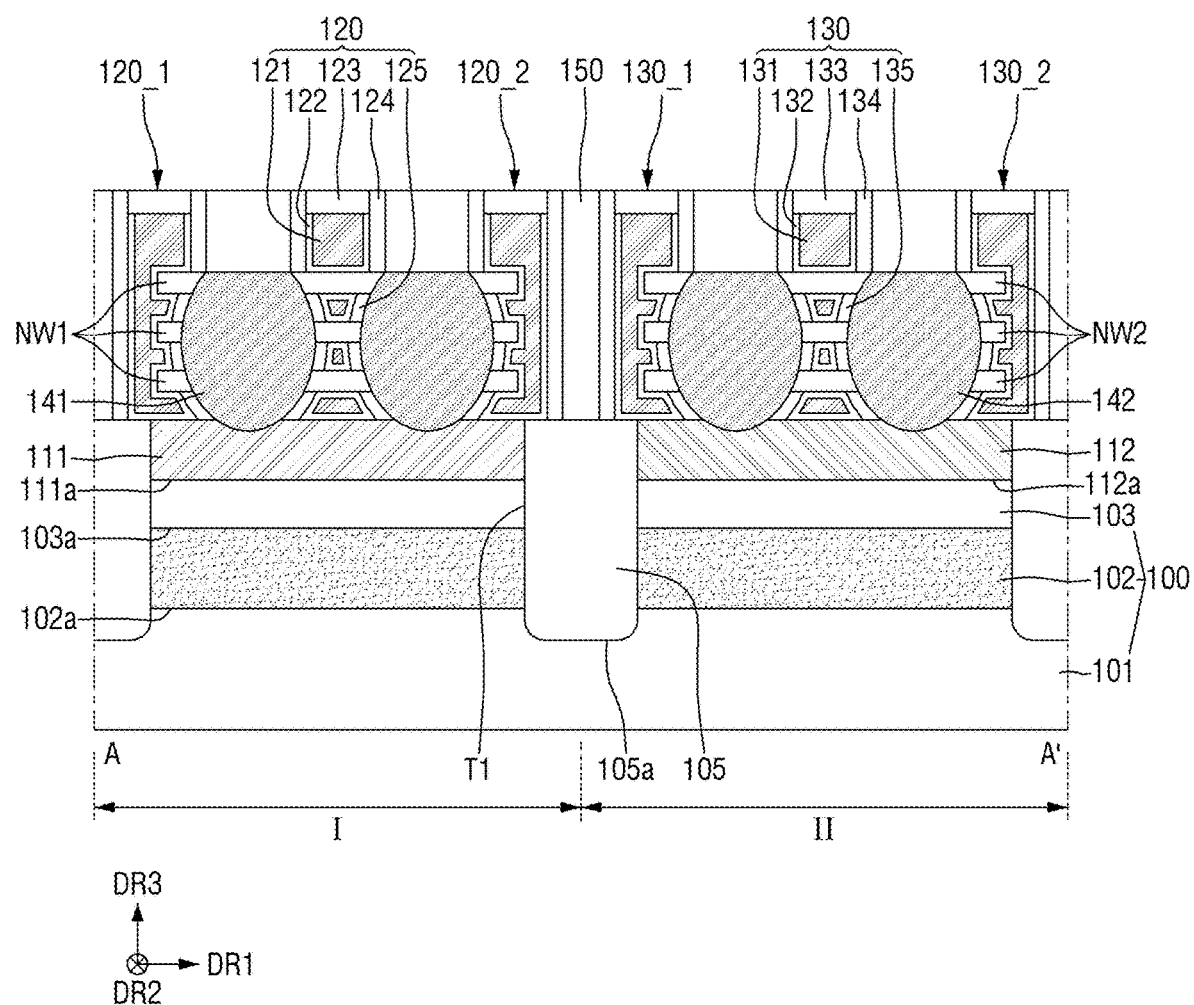

Referring to FIG. 18, the first gate insulating layer 122, the first gate electrode 121, and the first capping pattern 123 may be sequentially formed in a portion from which the first dummy gate 120D is removed. In addition, the second gate insulating layer 132, the second gate electrode 131, and the second capping pattern 133 may be sequentially formed in a portion from which the second dummy gate 130D is removed.

Referring to FIG. 2, the second interlayer insulating layer 160 may be formed to cover the first capping pattern 123, the second capping pattern 133, and the first interlayer insulating layer 150.

Subsequently, the silicide layer 175 and the first source/drain contact 171 may be formed on the first source/drain region 141. In addition, the silicide layer 175 and the second source/drain contact 172 may be formed on the second source/drain region 142.

In concluding the detailed description, those of ordinary skill in the art will appreciate that many variations and modifications can be made to example embodiments without substantially departing from the principles of inventive concepts. Therefore, example embodiments are used in a generic and descriptive sense only and not for purposes of limitation.

What is claimed is:

1. A semiconductor device comprising:
a first region including a first lower pattern and a second region adjacent to the first region including a second lower pattern;
a substrate including a first layer, an insulating layer on the first layer, the insulating layer having a first portion and a second portion, and a second layer on the insulating layer;
a first doped layer in the first region and on the second layer extending in a first direction, and including a first impurity;
a second doped layer in the second region and on the second layer, extending in the first direction, and including a second impurity different from the first impurity;
a first plurality of nanowires extending in the first direction on the first doped layer, and sequentially spaced apart from each other in a vertical direction;
a second plurality of nanowires extending in the first direction on the second doped layer and sequentially spaced apart from each other in the vertical direction;
a first gate electrode in a second direction that crosses the first direction, the first gate electrode surrounding the first plurality of nanowires;
a second gate electrode extending in the second direction, the second gate electrode surrounding the second plurality of nanowires; and
an element isolation layer configured to separate the first doped layer from the second doped layer, and contacting the insulating layer,
wherein the first lower pattern includes the first portion of the insulating layer and the second pattern includes the second portion of the insulating layer.

2. The semiconductor device of claim 1, wherein the second layer is separated by the element isolation layer.

3. The semiconductor device of claim 1, wherein the insulating layer is separated by the element isolation layer.

4. The semiconductor device of claim 1, wherein a bottom surface of the element isolation layer is inside the first layer.

5. The semiconductor device of claim 1, wherein a bottom surface of the element isolation layer is on the same plane as a bottom surface of the insulating layer.

6. The semiconductor device of claim 1, wherein a bottom surface of the element isolation layer is inside the insulating layer.

7. The semiconductor device of claim 1, wherein a bottom surface of the element isolation layer is on the same plane as a bottom surface of the second layer.

8. The semiconductor device of claim 1, wherein the insulating layer, the second layer, and the first doped layer protrude from the first layer in the vertical direction to be arranged as a first lower pattern, and
the insulating layer, the second layer, and the second doped layer protrude from the first layer in the vertical direction to be arranged as a second lower pattern.

9. The semiconductor device of claim 1, further comprising:
a first source/drain region on at least one side of the first gate electrode and at least partially extending into the first doped layer; and
a second source/drain region on at least one side of the second gate electrode and at least partially extending into the second doped layer.

10. The semiconductor device of claim 1, wherein the first region corresponds to an NMOS region, and the second region corresponds to a PMOS region.

11. The semiconductor device of claim 1, wherein each of the first layer and the second layer includes silicon (Si), and the insulating layer includes silicon oxide ($SiO_2$).

12. A semiconductor device comprising:
an NMOS region and a PMOS region adjacent to the NMOS region;
a first lower pattern protruding in a vertical direction from a first silicon layer in the NMOS region, extending in a first direction, and including a first portion of an insulating layer, a first portion of a second silicon layer, and a first doped layer including a first impurity, the first portion of the insulating layer, the first portion of the second silicon layer, and the first doped layer arranged sequentially on the first silicon layer;
a second lower pattern protruding in the vertical direction from the first silicon layer in the PMOS region, extending in the first direction, and including a second portion of the insulating layer, a second portion of the second silicon layer, and a second doped layer including a second impurity different from the first impurity, the second portion of the insulating layer, the second portion of the second silicon layer, and the second doped layer arranged sequentially on the first silicon layer;
a first plurality of nanowires extending in the first direction on the first lower pattern and sequentially spaced apart from each other in the vertical direction;
a second plurality of nanowires extending in the first direction on the second lower pattern and sequentially spaced apart from each other in the vertical direction;
a first gate electrode extending in a second direction crossing the first direction and surrounding the first plurality of nanowires;
a second gate electrode extending in the second direction and surrounding the second plurality of nanowires; and
an element isolation layer configured to separate the first lower pattern from the second lower pattern and contacting the insulating layer.

13. The semiconductor device of claim 12, wherein the second silicon layer is separated by the element isolation layer.

14. The semiconductor device of claim 12, wherein the insulating layer is separated by the element isolation layer.

15. The semiconductor device of claim 12, wherein a bottom surface of the element isolation layer is inside the first silicon layer.

16. The semiconductor device of claim 12, wherein a bottom surface of the element isolation layer is on the same plane as a bottom surface of the insulating layer.

17. The semiconductor device of claim 12, wherein a bottom surface of the element isolation layer is inside the insulating layer.

18. The semiconductor device of claim 12, wherein a bottom surface of the element isolation layer is on the same plane as a bottom surface of the second silicon layer.

19. The semiconductor device of claim 12, wherein each of a bottom surface of the first doped layer and a bottom surface of the second doped layer are higher than a bottom surface of the element isolation layer.

20. A semiconductor device comprising:
an NMOS region and a PMOS region adjacent to the NMOS region;
a substrate including a first silicon layer, an insulating layer on the first silicon layer, and a second silicon layer on the insulating layer;
a first doped layer on the second silicon layer in the NMOS region, extending in a first direction, and including a first impurity;
a second doped layer on the second silicon layer in the PMOS region, extending in the first direction, and including a second impurity different from the first impurity;
a first plurality of nanowires extending in the first direction on the first doped layer and sequentially spaced apart from each other in a vertical direction;
a second plurality of nanowires extending in the first direction on the second doped layer and sequentially spaced apart from each other in the vertical direction;
a first gate electrode extending in a second direction that crosses the first direction, the first gate electrode surrounding the first plurality of nanowires;
a second gate electrode extending in the second direction and surrounding the second plurality of nanowires;
a first source/drain region on at least one side of the first gate electrode and at least partially extending into the first doped layer;
a second source/drain region on at least one side of the second gate electrode and at least partially extending into the second doped layer; and
an element isolation layer configured to separate the first doped layer from the second doped layer, and having a bottom surface formed inside the first silicon layer,
wherein the insulating layer, the second silicon layer, and the first doped layer protrude from the first silicon layer in the vertical direction to be arranged as a first lower pattern, and
the insulating layer, the second silicon layer, and the second doped layer protrude from the first silicon layer in the vertical direction to be arranged as a second lower pattern.

* * * * *